US009489994B2

(12) United States Patent
Jefremow et al.

(10) Patent No.: US 9,489,994 B2
(45) Date of Patent: Nov. 8, 2016

(54) MEMORY TIMING CIRCUIT

(71) Applicant: Infineon Technologies AG, Neubiberg (DE)

(72) Inventors: Mihail Jefremow, Augsburg (DE); Ulrich Backhausen, Taufkirchen (DE); Thomas Kern, Ascheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/013,605

(22) Filed: Feb. 2, 2016

(65) Prior Publication Data

US 2016/0148662 A1 May 26, 2016

Related U.S. Application Data

(62) Division of application No. 14/249,996, filed on Apr. 10, 2014, now Pat. No. 9,281,032.

(51) Int. Cl.
| | |
|---|---|
| *G11C 7/00* | (2006.01) |
| *G11C 7/22* | (2006.01) |
| *G11C 7/06* | (2006.01) |
| *G11C 7/12* | (2006.01) |
| *G11C 7/04* | (2006.01) |
| *G11C 7/08* | (2006.01) |
| *G11C 7/10* | (2006.01) |
| *G11C 13/00* | (2006.01) |

(52) U.S. Cl.
CPC . *G11C 7/22* (2013.01); *G11C 7/04* (2013.01); *G11C 7/06* (2013.01); *G11C 7/062* (2013.01); *G11C 7/067* (2013.01); *G11C 7/08* (2013.01); *G11C 7/106* (2013.01); *G11C 7/12* (2013.01); *G11C 7/227* (2013.01); *G11C 13/004* (2013.01); *G11C 13/0061* (2013.01); *G11C 2207/2281* (2013.01)

(58) Field of Classification Search
CPC ........................................................ G11C 7/06
USPC ........................................................ 365/205
See application file for complete search history.

(56) References Cited

U.S. PATENT DOCUMENTS

| | | | |
|---|---|---|---|
| 4,677,590 A | 6/1987 | Arakawa | |
| 5,694,369 A | 12/1997 | Abe | |
| 7,327,619 B2 | 2/2008 | Chan et al. | |
| 8,102,689 B2 | 1/2012 | Hong et al. | |

(Continued)

FOREIGN PATENT DOCUMENTS

| | | |
|---|---|---|
| JP | H06-68684 A | 3/1994 |
| JP | H08-273365 A | 10/1996 |

(Continued)

OTHER PUBLICATIONS

Office Action dated Apr. 5, 2016 for Japanese Patent Application No. 2015-059883.

*Primary Examiner* — Hoai V Ho
(74) *Attorney, Agent, or Firm* — Schiff Hardin LLP

(57) ABSTRACT

A memory circuit including a memory cell configured to provide a charge, voltage, or current to an associated bit-line; a sense amplifier configured to sense the charge, voltage, or current on the bit-line; a word-line circuit configured to control a word-line of the memory cell; and a tracking circuit configured to track one or more conditions of the memory circuit and provide a timing control signal at an output operative to adaptively control the word-line circuit.

1 Claim, 6 Drawing Sheets

(56) References Cited

U.S. PATENT DOCUMENTS

| | | |
|---|---|---|
| 8,254,178 B2 | 8/2012 | Kern |
| 8,559,243 B2 | 10/2013 | Jefremow et al. |
| 2012/0163109 A1 | 6/2012 | Narayanaswamy et al. |
| 2012/0185664 A1* | 7/2012 | Anvar ............... G06F 13/4086 711/167 |
| 2012/0195106 A1 | 8/2012 | Wang et al. |
| 2012/0327727 A1 | 12/2012 | Wang |
| 2014/0071775 A1 | 3/2014 | Evans et al. |
| 2015/0078110 A1 | 3/2015 | Hong et al. |

FOREIGN PATENT DOCUMENTS

| | | |
|---|---|---|
| JP | H08-279296 A | 10/1996 |
| JP | H10-21688 A | 1/1998 |
| JP | 2000-516008 A | 11/2000 |
| WO | WO-97/24726 A1 | 7/1997 |

* cited by examiner

MEMORY TIMING CIRCUIT

RELATED APPLICATION

This application is a division of application Ser. No. 14/249,996 filed Apr. 10, 2014, which is hereby fully incorporated herein by reference.

BACKGROUND

Modern day electronic memory includes millions of memory cells, each respectively configured to store one or more bits of data (e.g., as an electric charge). Retrieval of data from a memory cell can be accomplished by a read operation, wherein electric charge stored in a memory cell is provided directly to a bit-line or sensed indirectly via the current of a transistor controlled by the charge. To conserve power, in one implementation, the electric charge generates a small voltage on the bit-line, which is subsequently amplified by a sense amplifier line into a "1" or a "0", by amplifying the small change in the bit-line voltage into a full logic voltage swing (e.g., 2.5V) (e.g., in DRAM applications).

Various memory technologies typically have their read and write cycles synchronized with the processor clock. A memory controller dictates the timing of word and bit-lines. Based on the address, one row (i.e., word-line) through the word-line decoder is selected (e.g., by applying an appropriate voltage), while all the other non-selected word-lines remain at 0V. Each cell of the selected word-line is either directly tied to a (primary) sense amplifier or is chosen by a 1:N mux to a sense amplifier. A sense amplifier is a circuit that is able to recognize if a charge has been stored in the memory cell, and to translate this charge or lack of charge into a 1 or 0, respectively.

There may be as many sense amplifiers as there are memory cells on a word-line of a memory array. Each sense amplifier is connected to a column (i.e., bit-line). In some implementations several bit-lines share the same sense amplifier via muxes. After a predetermined time, all the cells of the entire word-line are read by the sense amplifier. This step may take a long time because the word-line has a high time constant due to the many memory cells that may be connected thereto. Subsequently, voltage sense amplifiers typically compare the voltage on a bit-line to a reference bias voltage and amplify this voltage difference to a full supply level (e.g., a VDD voltage). Other types of sense amplifiers (like current sense amplifiers) compare the effective current of a memory cell with a reference current from a current source. For example for non-volatile memories based on floating gate memory cells, the charge stored in the floating gate determines the threshold voltage of the memory cell transistor and the current flowing through the memory cell.

The time to activate a word-line and subsequently the sense amplifier ON and OFF (and the time duration in each state) may be based on predetermined timing sequences. These timing sequences are typically based on worst case condition assumptions to provide sufficient margin. For example, instead of basing the read timing on a nominal read access time when operating at 25° C., one or more guard-bands may be introduced with respect to one or more of the following variations: temperature, power supply, transistor parameter, aging, etc.

The control of the memory timing operation based on worst case scenarios contributes to additional power consumption and leads to reliability concerns. For example, keeping circuits ON for longer than necessary consumes additional power and may degrade the reliability of the components by exposing these circuits to higher voltages and/or currents for unnecessarily long durations to accommodate worst case margins. Also some sensing systems are controlled by clocked systems, where the clock cycle times of lower end products may be longer than the actual sensing times of the memories. For such lower end products the sense amplifiers and supporting circuits may be switched ON longer than necessary and thus consume more power.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various examples disclosed herein generally relate to methods and systems of better optimizing the activation and duration of support circuitry for memory cells in a memory array. The term support circuitry, as used herein, relates to circuits outside the memory array that provide access to the memory cells, such as decoders, drivers, sense-amps, etc., that are used in connection with the word-line and/or bit-line path of a memory array. Instead of being controlled by an external controller, the support circuitry is, at least in part, controlled internally by the memory circuit (e.g., semiconductor chip) itself. The activation, duration, and/or regulation of the support circuitry are based on tracked conditions of the memory circuit, such as temperature, voltage, performance degradation, and the like. By regulating the support circuitry based on the tracked conditions of the memory circuit, the power consumption is reduced and the overall reliability of the memory circuit is improved, thereby better optimizing the performance of the memory circuit.

Figure 1:
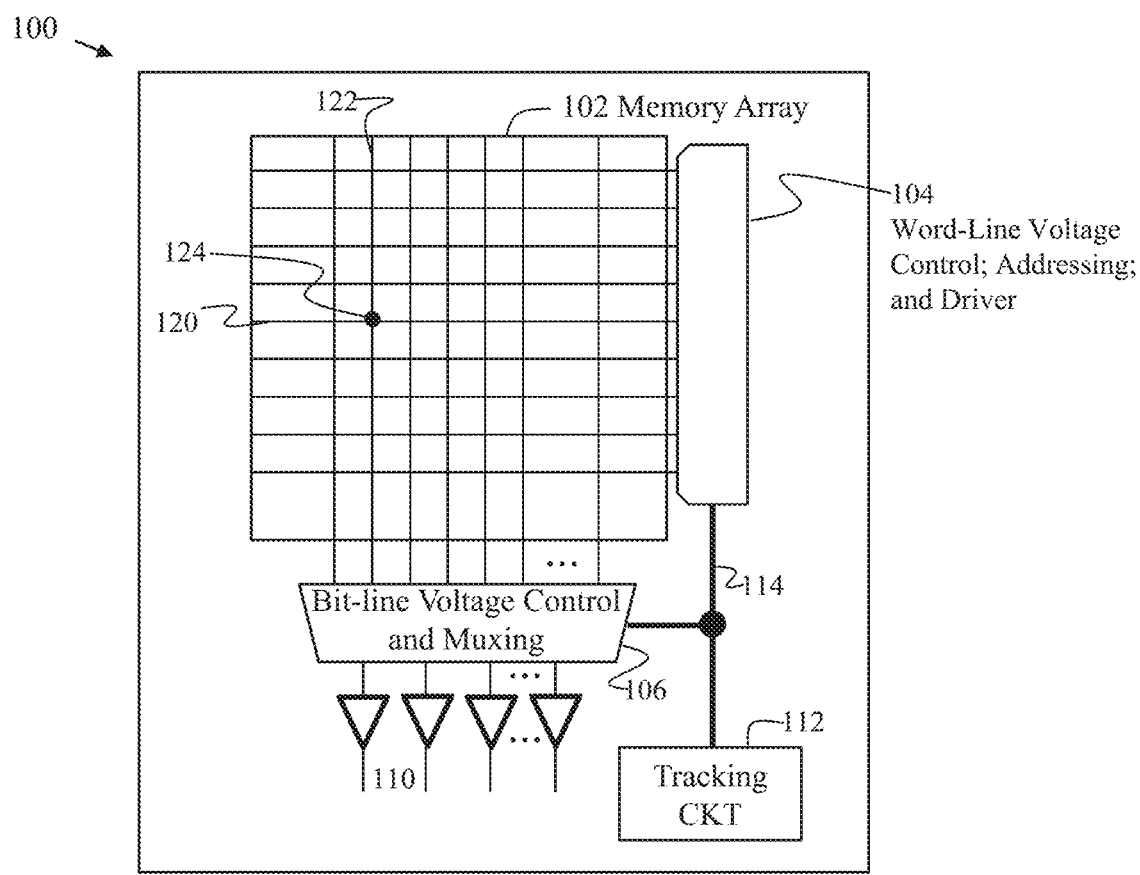
FIG. 1 illustrates a memory circuit in accordance with an exemplary embodiment.

Reference will now be made in detail to embodiments of the disclosure, examples of which are described herein and illustrated in the accompanying drawings. FIG. 1 illustrates a memory circuit 100 in accordance with an exemplary embodiment. Memory circuit 100 includes a memory array 102 having memory cells (e.g., at the intersection bit-lines and word-lines). The memory cells are configured to store charge associated with a data state (e.g., "1" or "0"). It will be understood that the memory cell may be any suitable memory depending on the application, such as DRAM, SRAM, TRAM, ZRAM, FLASH, MRAM, RRAM, PRAM, etc. The information in a memory cell is selectively coupled to its associated bit-line upon activation. Depending on the type of technology used, the memory cell is configured to provide a charge, voltage, or current to an associated bit-line.

A row of memory cells may share the same word-line (e.g., 120). A memory cell (or the memory cells associated with the word-line) are activated when its corresponding word-line is selected. In this regard, word-line circuit 104 controls the selection and activation of the word-lines, respectively. The word-line circuit 104 may include a voltage control circuit(s) (e.g. voltage pumps, regulators, and switches), addressing circuit(s), and drivers.

A driver may include a chain of inverters with increasing current drive capability to charge the word-line (with relatively high capacitance) to achieve a targeted voltage in a reasonable time (e.g., less than the total read time). A driver may also include a level shifting circuit to set the word-line to a higher voltage than the core voltage of the system. For example, the level shifting circuit may be used for non-volatile memories, which may operate at a higher gate voltage of the memory cell transistor.

The memory circuit 100 also includes one or more sense amplifiers 110, which are configured to sense one of a (i) charge, (ii) voltage, or (iii) current on the corresponding bit-line. Accordingly, depending on the type of memory cell used for a particular application, the sensed signal may be a charge, a current flowing through the selected memory cell, or a voltage on the selected bit-line. A sense amplifier may be an analog to digital (A/D) converter in that it measures the analog signals at its input and provides a digital signal (i.e., "1" or "0") at its output. Thus, a digital output is provided by the sense-amplifier 110 corresponding to the data state stored in the memory cell (e.g., 124) that is being read via its bit-line (e.g., 122). The memory circuit 100 includes a bit-line circuit 106, which may include voltage control and/or mux circuits. For example, a mux circuit in the bit-line circuit 106 allows several bit-lines to share the same sense amplifier.

The cells of the entire word-line (e.g., word line 120) are read by the corresponding sense amplifiers (110). The time it takes to raise a word-line (e.g., 120) depends on several factors, including the number of cells on the word-line, the temperature of the memory circuit 100, the current or voltage applied to activate the word-line, leakage (e.g., due to degradation), and other process variations. Similar issues apply to the bit-line path.

It will be understood that the longer the word-line 120, and the greater the amount of the word-line circuit 104, sense amplifiers 110, bit-line circuit 106, and/or memory array is activated, the more power is consumed. Further, exposing these circuits and cells to high voltages (i.e., during activation) adversely affects the same (e.g., leads to reliability concerns). In this regard, memory circuit 100 includes a tracking circuit 112 that adaptively controls at least one of (i) the word-line circuit 104, (ii) the bit-line circuit 106, and (iii) the sense amplifier 110 bias. Tracking circuit 112 provides a timing control signal 114 that includes timing information used to adaptively control the timing of the word-line circuit 104, bit-line circuit 106, and/or sense amplifiers 110 based on the tracked temperature, voltage, and/or process variations. Upon determining that a predetermined criteria is met (e.g., the sensed bit-line voltage is above a threshold), tracking circuit 112 provides one or more timing control signals 114 (e.g., "ready" signals), which instruct the receiving circuits (e.g., 104, 106, and 110 in this example) when to turn ON, OFF, and/or transition to a lower voltage state.

Accordingly, instead of relying on external control signals which typically include substantial guard-bands, in one embodiment, the memory circuit 100 itself provides a global timing control of at least one of (i) the word-line circuit 104, (ii) bit-line circuit 106, and (iii) sense-amplifiers 110. For example, the memory circuit 100 may start with a reading operation of the memory (e.g., via an instruction from an external controller). The tracking circuit 112 is configured to determine when the reading operation completes. The more severe the conditions under which the memory circuit 100 is operating (e.g., low voltage, high temperature, process degradation, leakage, etc.,) the longer it may take to complete the read operation.

Upon determining that the read operation is complete, the tracking circuit 112 indicates a "ready" state via the timing control signal 114 (sometimes referred herein as the ready signal). In this regard, parts of the memory array 102, which are no longer used, may be turned OFF. For example, word-line circuit 104 may turn OFF (or transition to a low current state) the word-line voltage control circuit(s), addressing circuit(s), and/or drivers. Similarly, the bit-line circuit 106, may turn OFF (or transition to a low current state) the voltage control and/or mux circuits. Still further, the analog sense amplifiers 110, which may operate with a standby bias current, by be turned OFF (or operated in a low current state).

Accordingly, instead of controlling the timing of the word-line circuit 104, bit-line circuit 106 and sense amplifiers 110 synchronously based on worst case assumptions, in one embodiment, the tracking circuit 112 provides asynchronous control of the same based on actual conditions in which the memory circuit 100 is operating. Consequently, the memory circuit consumes less power and operates more reliably by reducing the time the respective circuits are exposed to potentially harmful voltage and/or current levels.

Figure 2:
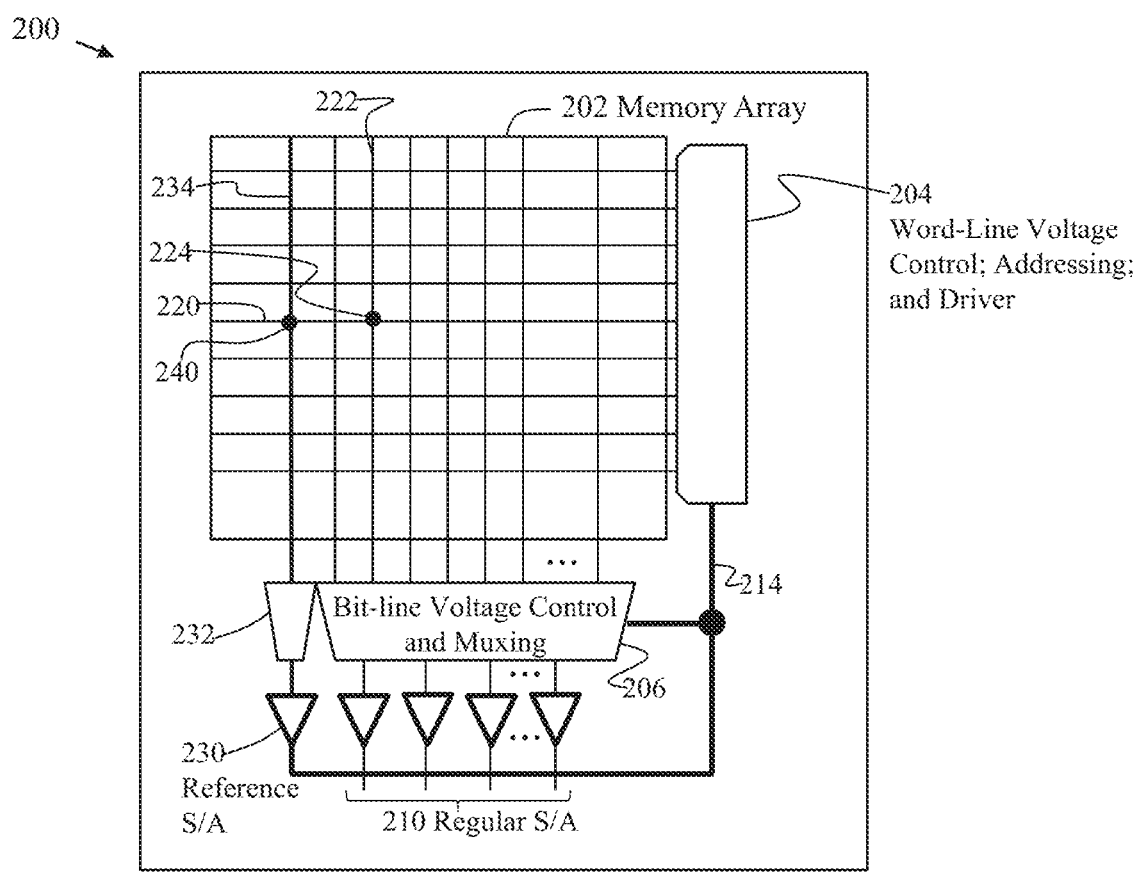
FIG. 2 illustrates a memory circuit using a reference sense amplifier as a tracking circuit in accordance with an exemplary embodiment.

With the foregoing overview of the memory circuit 100, it may be helpful now to provide different examples of tracking circuits. To that end, FIG. 2 illustrates a memory circuit 200 using a reference sense amplifier 230 as a tracking circuit, in accordance with an exemplary embodiment. Reference sense amplifier 230 is coupled to a reference bit-line 234 via a bit-line circuit 232. The reference sense amplifier 230 may have substantially similar characteristics to those of the regular sense amplifiers (e.g., 210). Similarly, the reference bit-line 234 may have substantially similar characteristics to the regular bit-lines (e.g., 222), the bit-line circuit 232 may have substantially similar characteristics to the regular bit-line circuit 206, and the memory cells (e.g., 240) on the reference bit-line 234 may have substantially similar characteristics to a regular memory cell 224. Thus, voltage, temperature, and process variations that may affect the memory circuit 200 during a read operation are tracked by the reference sense amplifier 230 because the reference path is substantially similar to a regular bit-line path (e.g., 222) and the reference sense amplifier 230 is operated under similar conditions as the regular sense amplifiers 210. As discussed above, the reference element 240 may be a memory cell having a configuration substantially similar to that of a regular memory cell 224. In another embodiment, the reference element 240 is a reference current generator configured to generate a fixed adjustable reference current.

For example, the word-line circuit 204 activates a word-line (e.g., 220) (e.g., charges the word-line to a predetermined voltage), thereby allowing the memory cells on the word-line (e.g., 220) to provide their charge on their corresponding bit-lines for voltage sensing. In another implementation, the current of the memory cell is either high (if a relatively low charge is stored in the cell) or low (if a relatively significant charge is stored in the cell. For purposes of simplicity, it will be assumed that a voltage is sensed, while it will be understood that the sense amplifier 210 may be configured to sense a charge of current.

Sense amplifiers 210 are then activated to read the information from the corresponding bit-lines connected to the cells. At the same time, the reference sense amplifier 230 is activated as well. A regular sense amplifier 210 compares the voltage on a bit-line (e.g., 222) to a reference bias voltage (or the current to a reference current and amplifies the result of the comparison to provide a high (e.g., VDD) or low (e.g., ground) at its output.

Accordingly, the time it takes a regular sense amplifier 210 (whether operating under harsh (e.g., high temperature and/or low voltage) or beneficial (e.g., low temperature, high voltage) conditions) to determine the charge stored in a memory cell (e.g., 224) may be tracked by the reference sense amplifier 230 since the reference sense amplifier 230 operates under substantially similar conditions. In this regard, the reference sense amplifier 230 indicates a ready state via the timing control signal 214 operative to control one or more elements of the support circuitry. For example, instead of keeping word-line circuit 204, and/or the bit-line circuit 206 ON for a duration based on worst case assumptions, these circuits can be turned OFF by an internal timing control signal (i.e., "ready" 214) based on real (i.e., actual) operating conditions. Similarly, the sense amplifiers 210 can be turned OFF or operated in low current state responsive to the ready signal from the reference sense amplifier 230 (when the sensing operation completes).

Figure 3:
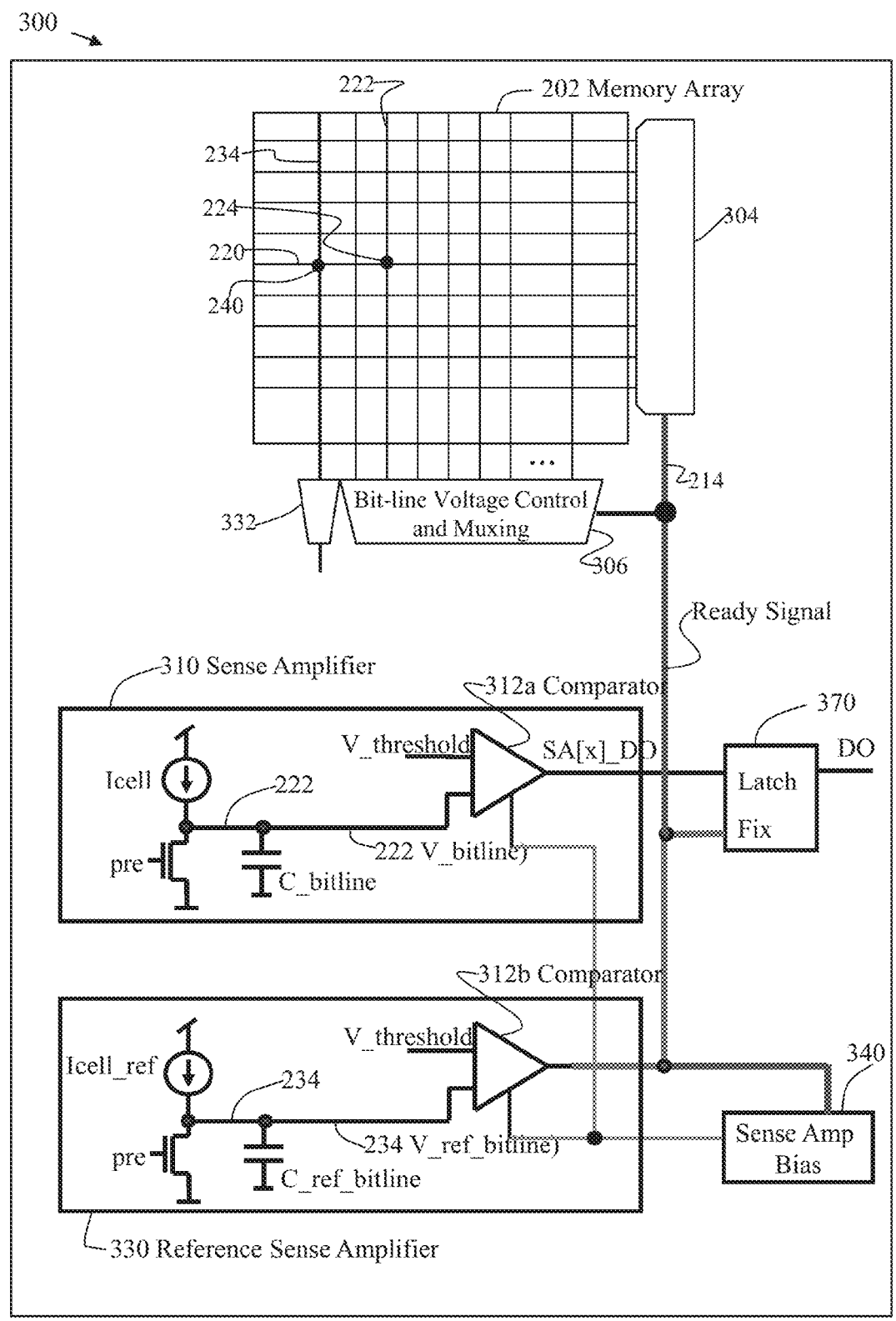
FIG. 3 illustrates a more detailed view of a memory circuit using a reference sense amplifier as a tracking circuit in accordance with an exemplary embodiment.

FIG. 3 illustrates a more detailed view of a memory circuit 300 using a reference sense amplifier 310 as a tracking circuit in accordance with an exemplary embodiment. By way of example, FIG. 3 illustrates a sense amplifier 310a having a comparator 312a. A bit-line 222 (represented in the context of the sense amplifier 310a as a capacitor C_bitline) is initially pre-charged to a predetermined voltage.

In one example the bit-line 222 is discharged to ground level. After the first pre-/discharging phase, the sensing phase starts. In one embodiment, the current flowing through the activated memory cell is based on the charge stored therein. If there is a current, then the bit-line is charged by that current and the voltage level increases (e.g., from ground level). The comparator 312a of the sense amplifier 310 then compares the voltage on the bit-line 222 to a predetermined threshold voltage (V_threshold). For example, if the bit-line voltage 222 is above the threshold voltage, the comparator 312a provides a HIGH at its output, and if the bit-line voltage 222 is below the threshold voltage, the comparator 312a provides a LOW at its output. As discussed above, the duration of the sensing operation varies with operating conditions, such as temperature, voltage, and transistor parameters. In one embodiment, the system usually checks the output of the sense amplifier after a predetermined time. The system may be the component (e.g., controller, CPU core, etc.,) that has initiated the read request to the memory circuit 300.

The reference sense amplifier 330 has a configuration substantially similar to that of the regular sense amplifier 310. Further, it is operated under substantially similar conditions as the regular sense amplifier 310. Accordingly, the time it takes the comparator 312b of the reference sense amplifier 330 to compare the voltage of the reference bit-line 234 to a predetermined threshold voltage is substantially similar to that of the regular sense amplifier 310. The tracking circuit (i.e., reference sense amplifier 330 in this example) is therefore able to track the timing status of the regular sense amplifier 310.

In one embodiment, the output of the sense amplifier 310 is coupled to a latch 370. The latch 370 acts as a storage element configured to take a clocked sampling of the sense amplifier 310 output signal SA[X]_DO. In this example of FIG. 3, the signal used to store the output signal of the sense amplifier 310 in the latch 370 is the "ready" signal at the output of the reference sense amplifier 330. Thus, the digital reference output signal (i.e., "ready") is generated by the reference sense amplifier 330 upon comparing the voltage on the reference bit-line 234 to a predetermined threshold voltage (V_threshold). In this embodiment the voltage of the reference bit-line 234 is provided by charging the reference bit-line 234 from a predetermined level (e.g., ground) by a controlled reference current. Thus, the controlled reference current charges the reference bit-line 234 (e.g., linearly) and when the voltage level of the reference bit-line 234 exceeds a predetermined threshold (V_threshold), a "ready" signal is provided at the output of the reference sense amplifier 330.

This reference current is set such that it can safely determine the threshold, thereby distinguishing the state (e.g., 0 or 1) of the memory cell. For example, the reference current charges the reference bit-line 234. The current of a memory cell in an erased state is higher than the reference current. In this regard, the sense amplifier of an erased cell flips earlier than the reference amplifier, thereby indicating that a "0" is stored in the memory cell. On the other hand, the current of a memory cell in a programmed ("1") state is comparatively low. In this regard, the reference current charges the reference bit-line 234 faster than that of the programmed cell. Thus, the "ready" signal from the reference sense amplifier 330 is provided earlier than that of the reference cell, thereby indicating that a "1" is stored in the memory cell.

In one embodiment, the "ready" state provided via the timing control signal at the output of the reference sense amplifier 330 (sometimes referred herein as the ready signal) is used additionally (or instead) to control the word-line circuit 304. The word-line circuit 304 may include one or more voltage control circuit(s), addressing circuit(s), and/or drivers. For example, the ready signal indicates to the word-line circuit 304 that the sensing operation is complete and that at least one of the (i) voltage control circuit(s), (ii) addressing circuit(s), and (iii) driver(s) can be turned either completely OFF or operated in a low current state.

In one embodiment, the "ready" signal at the output of the reference sense amplifier 330 is used additionally (or instead) to control the bit-line circuit 306, which may include voltage control and/or mux circuits. Similar to the word-line circuit 304, the ready signal may indicate to the bit-line circuit 306 that the sensing operation is complete and that at least one of the (i) voltage control circuit(s) and (ii) mux circuit(s) can be turned either completely OFF or operated in a low current state.

In one embodiment, the "ready" signal at the output of the reference sense amplifier 330 is used additionally (or instead) to control the sense amplifier bias circuit 340. For example, the ready signal may indicate to the sense amplifier bias circuit 340 that the sensing operation is complete. In this regard one or more sense amplifiers (e.g., 310) may be turned OFF. More specifically, the comparator circuit 312a of a sense amplifier 310 may be operated in a low current state to prevent unnecessary current consumption and circuit degradation.

In one implementation, the ready signal of the reference sense amplifier 330 indicates to the sense amplifier bias circuit 340 to control the bias of the comparators 312a, 312b of the sense amplifiers 310, 330. The change of the bias current of the reference sense amplifier 330 (or other circuits based on the ready signal) does not lead to a change of the read result at the output of the respective sense amplifier. Oscillations are thereby prevented.

Figure 4:
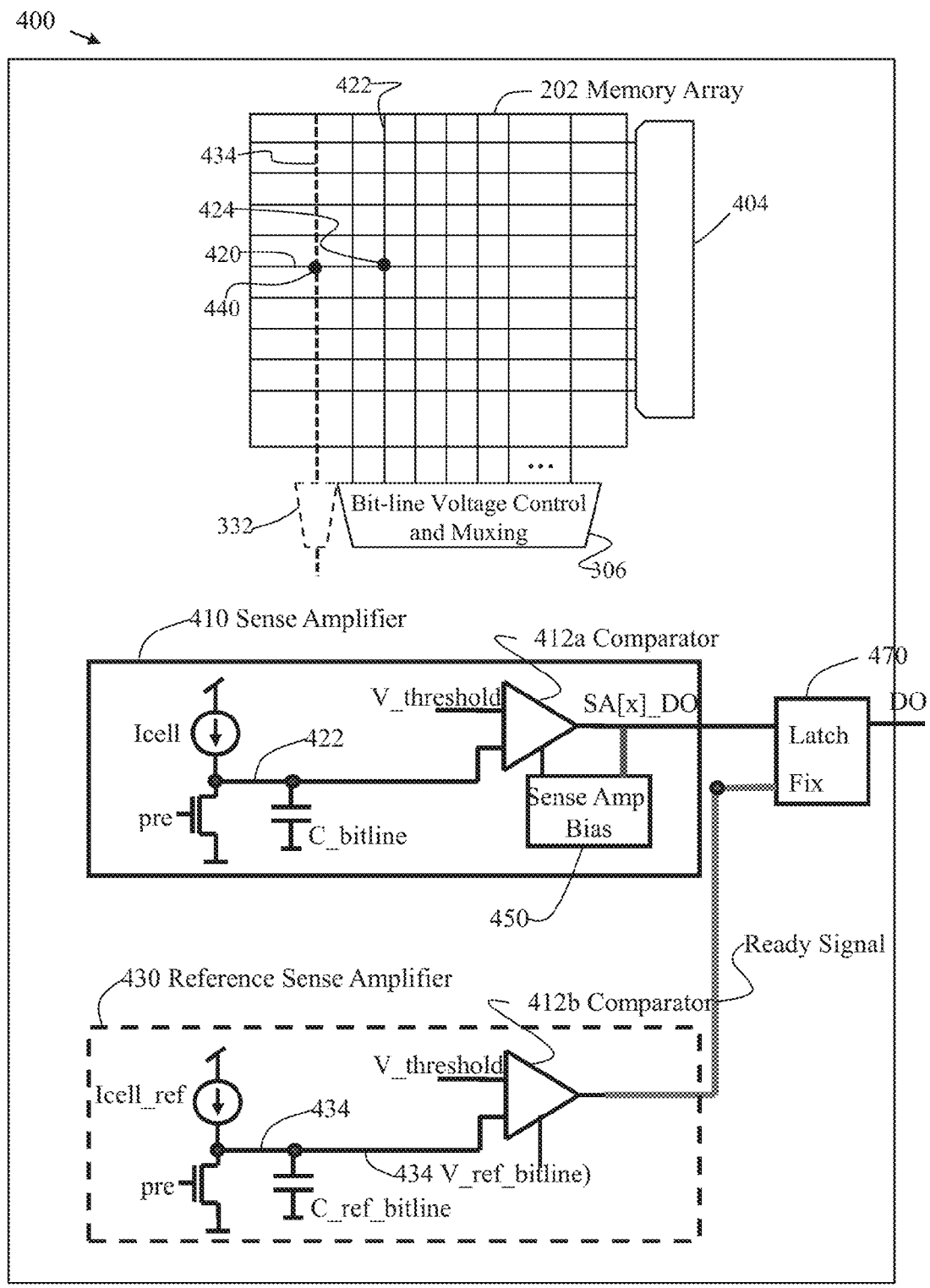
FIG. 4 illustrates a memory circuit having local control of the sense amplifier in accordance with an exemplary embodiment.

FIG. 4 illustrates a memory circuit 400 having local control of the sense amplifier 410 in accordance with an exemplary embodiment. Memory circuit 400 includes a sense amplifier 410 having a comparator 412a. A bit-line 422 (represented in the context of the sense amplifier 410 as a capacitor C_bitline) is initially pre-charged to a predetermined voltage. It will be understood that the predetermined voltage may include ground level. After the first pre-/discharging phase the sensing phase starts. In one embodiment, the current flowing through the activated memory cell is based on the charge stored therein. If there is a current, then the bit-line is charged by it and the voltage level increases (e.g., from ground level). The comparator 412a then compares the voltage on the bit-line 422 to a predetermined threshold voltage. For example, if the bit-line voltage 422 is on or above the threshold voltage, the comparator 412a provides a HIGH at its output. Upon determining that the bit-line voltage 422 is below the threshold voltage, the comparator 412a provides a LOW at its output.

As discussed in the context of memory circuit 300 above, the time it takes for the sensing operation varies with operating conditions, such as temperature, voltage, transistor parameters, etc. In this regard, the sense amplifier 410 locally controls its own timing by providing a local "finish" signal at the output of its comparator 412a. The local "finish" signal (i.e., SA[X]_DO) is used to control the sense amplifier bias 450 by turning it OFF or placing it in low current state upon completion of the sensing operation. Thus, in one embodiment, each sense amplifier 410 locally controls the duration of the sensing operation, thereby reducing power consumption and circuit degradation. Put differently, the timing of a regular sense amplifier 410 is independent of a reference sense amplifier 430.

In one embodiment the sense amplifier 410 is switched OFF at the "ready" signal of the reference sense amplifier 430 even if the regular sense amplifier 410 has not yet changed its state. Such early termination is possible because the reference sense amplifier also provides a timing reference: in the situation where a regular (data) sense amplifier (e.g., 410) has not yet changed its state when the "ready" signal from the reference sense amplifier 430 is triggered, it indicates that the data for this regular sense amplifier can be set to a value a programmed cell value (e.g. "1"). Accordingly, it is no longer necessary to operate the regular sense amplifier 410 in that cycle.

Figure 5:
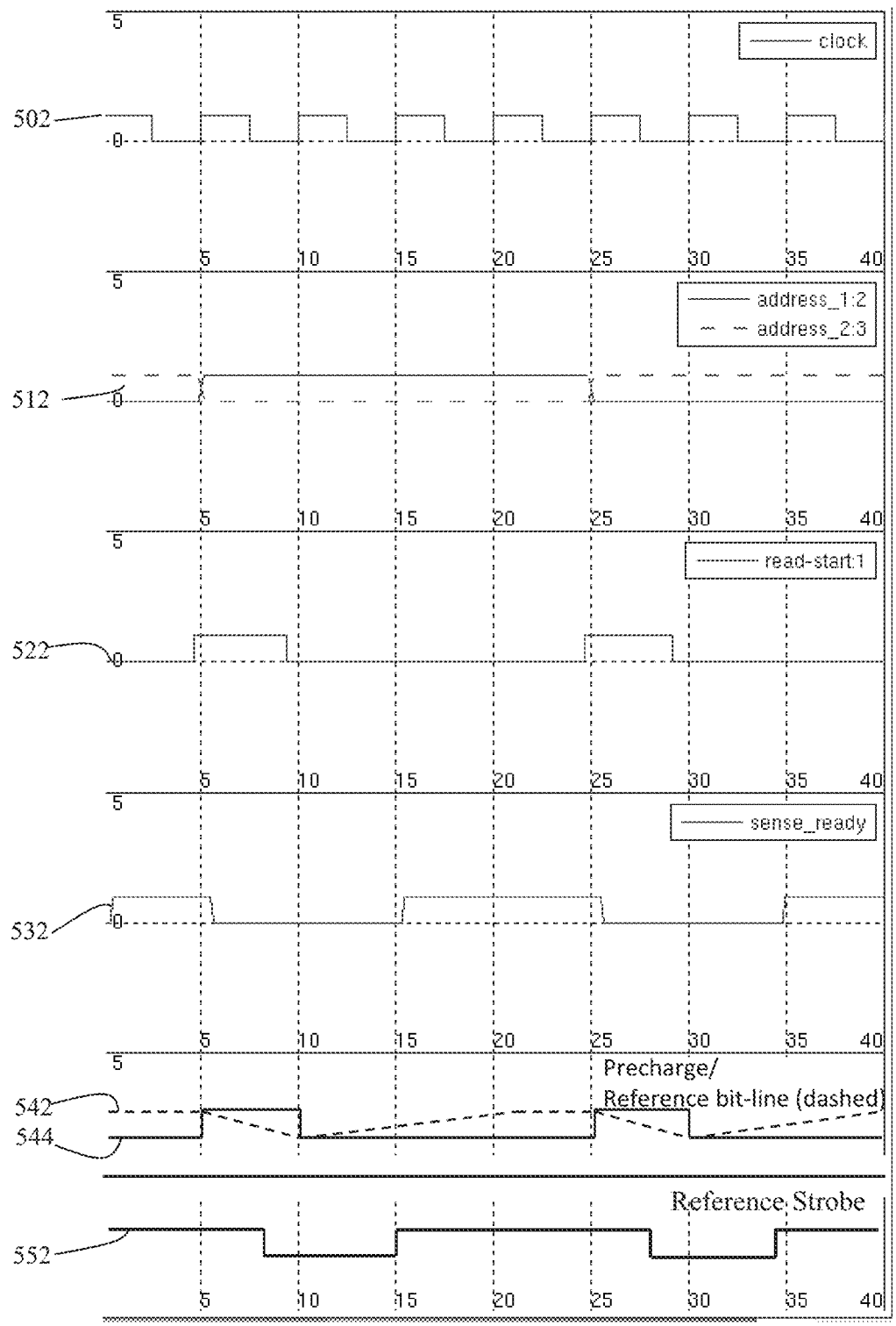
FIG. 5 illustrates a timing diagram of a memory circuit in accordance with an exemplary embodiment.

It may be helpful now to consider a high level timing example of a memory circuit. To that end, FIG. 5 illustrates a timing diagram of a memory circuit in accordance with an exemplary embodiment. Waveform 502 is a reference clock that operates at 200 MHz (with a cycle time of 5 ns). Waveforms 512 illustrate address signals for the memory array. Address changes occur at 5 ns and 25 ns. A memory address may be provided by a (e.g., external) memory controller. Based on the address, one word-line is selected through the word-line circuit (e.g., via decoders). The selected word-line is turned ON (e.g., charged to a predetermined voltage value) while all other non-selected word-lines are kept OFF (e.g., at ground level).

Waveform 522 is a synchronous read start signal that is being registered at 5 ns (the timing diagram indicates the setup time). This waveform 522 indicates the start of read operation at 5 ns. This is not the end of the read operation. The signal simply indicates the start of the read operation at 5 ns (where the falling edge of the signal is not relevant in this example). The second read operation begins at 25 ns. Usually the read start signal 522 is high at the start of the reading process (e.g., rising edge) and goes low at the rising edge of the following clock cycle 502.

Waveform 532 illustrates a sense amplifier "ready" signal. For example, this "ready" signal may be provided at the output of a reference amplifier 330 of FIG. 3. As discussed above in connection with signal 522, the read operation commences at 5 ns. Then, all the bit-lines are discharged to ground level (see waveform 542). The discharge is triggered by a timing signal (waveform 544). After ~5 ns, this phase completes (e.g., at ~10 ns) and the sense amplifier is activated. In one embodiment, reference sense amplifier is activated at substantially the same time as the regular sense amplifier. According to signal 532, the sensing is complete at 15 ns. The availability status is tracked by the reference sense amplifier over process, temperature, and voltage variations because the reference sense amplifier has a configuration substantially similar to that of a regular sense amplifier and is operated in a substantially similar way (e.g., same length bit-line, similar cycles used, etc.). In this example, the sensing operation takes approximately 10 ns (i.e., from 5 ns to 15 ns) and is divided into 2 phases (the pre/discharge phase from 5 ns to 10 ns and the actual sensing phase from 10 ns to 15 ns). However, when the voltage changes, temperature varies, and as the memory chip ages (e.g., degrades over time), it will be understood that the sensing operation may take more (or less) time.

In one embodiment, the sense amplifier "ready" signal is provided by the regular sense amplifier (i.e., not the reference sense amplifier) to provide a local sensing and control of its sense amplifier. For example, the regular sense amplifier (e.g., 410 of FIG. 4) uses its own sense amplifier output signal (e.g., SA[x]_DO) as a trigger to control its sense amplifier bias circuit 450. Upon determining that the sense operation is complete, the sense amplifier (e.g., 410) turns OFF (or transitions to a low current state). In one embodiment, the output of the sense amplifier SA[X]_DO is latched by latch 470 when the reference sense amplifier 430 provides a ready signal.

In one embodiment, if bit-line is discharged to ground in a pre-charge phase (e.g., voltage of bit-line<predetermined threshold) the output of the sense amplifier is HIGH. If there is a memory cell with sufficient charge stored therein, it may charge the bit-line in a relatively short time to a voltage>predetermined threshold. The output of the sense amplifier transitions to LOW in a sense phase (which triggers the change of the sense Amp bias). However, if the charge of the memory cell is low, then the output of the sense amplifier stays HIGH.

Waveforms 542, and 544 illustrate the pre-charge and reference bit-line, respectively. For example, the bit-line is pre-charged between 5 to 10 ns.

Figure 6:
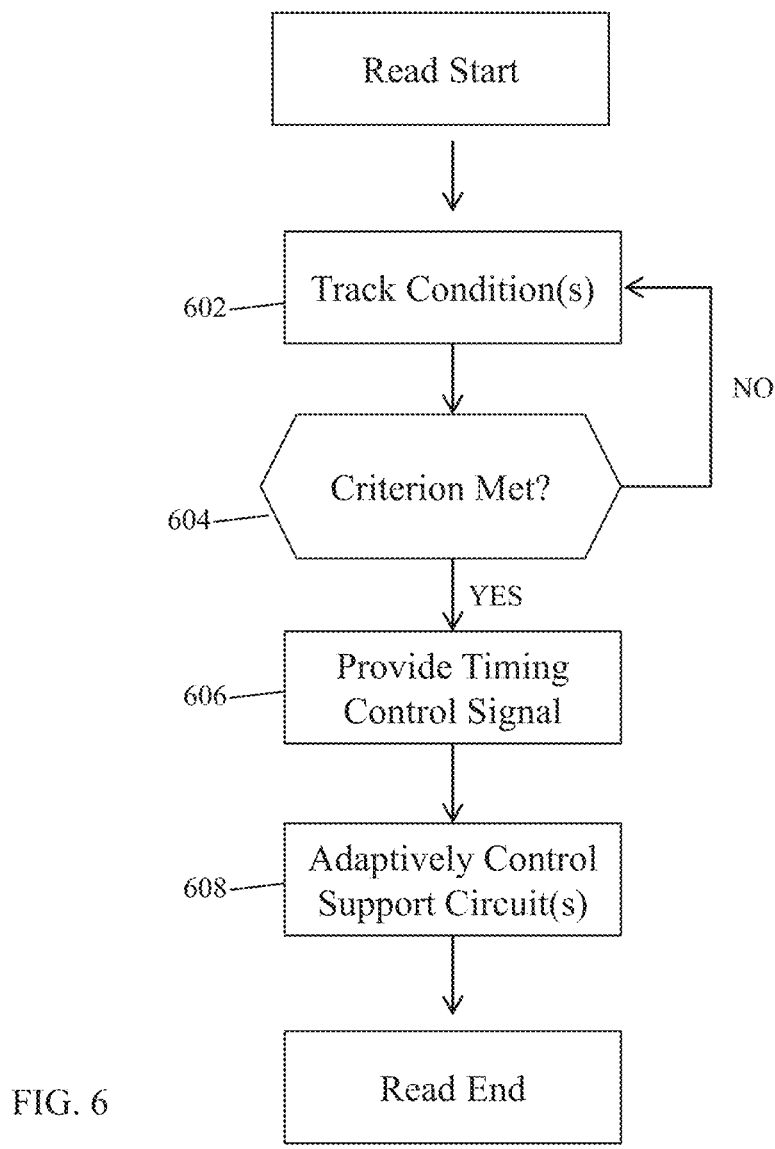
FIG. 6 illustrates a flowchart of a method of controlling a memory cell in accordance with an exemplary embodiment.

FIG. 6 illustrates a flow-chart of a method of controlling a memory cell in accordance with an exemplary embodiment. In step 602, one or more conditions of the memory circuit are tracked by a tracking circuit. As discussed above, such conditions may include temperature, voltage, performance degradation, and the like. In one embodiment, the tracking circuit includes a reference bit-line path that is substantially similar to that of a regular bit-line path. Thus, the reference sense amplifier coupled to a reference bit-line with one or more reference memory cells is configured to be substantially similar to its regular counterpart. In another embodiment the tracking is performed locally within each sense amplifier.

In step 604, a determination is made whether a criterion is met. In one embodiment, the criterion is the completion of the sensing operation of the tracking circuit. For example, it is determined whether the charge on a reference bit-line of the tracking circuit is above a predetermined threshold. If not, the tracking circuit continues to be in the tracking condition(s) mode 602.

In step 606, upon determining that the criterion is met, a timing control signal is provided to one or more peripheral circuits. For example, this signal may be provided to at least one of the at least one of (i) the word-line circuit, (ii) bit-line circuit, and (iii) sense-amplifiers.

In step 608, the one or more support circuits are adaptively controlled via the timing control signal. Thus, the timing of the word-line circuit, bit-line circuit, and/or sense amplifiers is controlled based on the tracked temperature, voltage, and/or process variations. The timing control signal (e.g., "ready" signals) may instruct the receiving circuits when to turn ON, OFF, and/or transition to a lower voltage state.

In various embodiments, the tracking circuits discussed herein track and automatically adjust the support circuit(s) to prevent unnecessary power consumption and ultimately improve reliability of the circuits exposed to the controlled voltages. For example, by reducing the time that circuits are exposed to high voltage (e.g., word-line, bit-line, decoders, drivers, sense-amplifiers, etc.), the less power is consumed and reliability is improved.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.,), or converted to another state (e.g., from HIGH to LOW and LOW to HIGH) without materially changing the underlying control method. Further, bipolar transistors (e.g., PNP or NPN) can be used instead of MOS transistors. A PNP may be used instead of NPN, and a PMOS may be used instead of NMOS. Further, the memory cell and array discussed herein may be any known volatile or non-volatile memory. Examples of memory array types include, but are not limited to, ROM, DRAM, Phase Change RAM, SRAM, MRAM, etc. Accordingly, it is intended that the invention be limited only in terms of the appended claims.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:
1. A memory circuit, comprising:
   a memory cell configured to provide a charge, voltage, or current to an associated bit-line;
   a word-line circuit configured to control a word-line of the memory cell;
   a bit-line circuit having at least one of (i) a bit-line voltage control circuit and (ii) a mux circuit; and
   a sense amplifier comprising a local sense amplifier bias circuit, wherein the sense amplifier is configured to sense the charge, voltage, or current on the bit-line and locally control its local sense amplifier bias circuit by turning the local sense amplifier bias circuit OFF or placing it in low power state, upon determining that the charge, voltage, or current on the bit-line is above a predetermined threshold.

* * * * *